United States Patent [19]

Malhi et al.

[11] Patent Number: 4,855,809
[45] Date of Patent: Aug. 8, 1989

[54] ORTHOGONAL CHIP MOUNT SYSTEM MODULE AND METHOD

[75] Inventors: Satwinder Malhi, Garland; Kenneth E. Bean, Celina; Charles C. Driscoll, Richardson; Pallab K. Chatterjee, Dallas, all of Tex.

[73] Assignee: Texas Instruments Incorporated, Dallas, Tex.

[21] Appl. No.: 125,033

[22] Filed: Nov. 24, 1987

[51] Int. Cl.⁴ .............................................. H01L 23/16
[52] U.S. Cl. ......................................... 357/75; 357/74; 357/71; 357/80
[58] Field of Search .......................... 357/75, 74, 71, 80

[56] References Cited

U.S. PATENT DOCUMENTS 4,237,522 12/1980 Thompson ........................... 361/392
4,695,872 9/1987 Chatterjee ............................... 357/75

Primary Examiner—Andrew J. James
Assistant Examiner—David Soltz
Attorney, Agent, or Firm—Stanton Braden; Rodney M. Anderson; Melvin Sharp

[57] ABSTRACT

An orthogonal chip mount system module (10) comprising a base module (12), an interconnect chip (14), orthogonal slots (16) and semiconductor chips (18) is provided. The interconnect chip (14) is fixed to the base module (12) by high thermal conductivity epoxy. The semiconductor chips (18) are interference fitted into the slots (16). Solder pads (20) on the semiconductor chips (18) are aligned with solder pads (22) on the interconnect chip (14) and the system module (10) is then heated to the reflow temperature of the solder forming joints (24).

20 Claims, 1 Drawing Sheet

ORTHOGONAL CHIP MOUNT SYSTEM MODULE AND METHOD

TECHNICAL FIELD OF THE INVENTION

This invention relates in general to semiconductor mounting structures, and in particular to an apparatus and method for orthogonally mounting semiconductor chips to form a system module.

BACKGROUND OF THE INVENTION

The downscaling of devices in integrated circuit technology has permitted an improvement in the density of electronic integrated circuits. While it is desirable to continue searching for ways to further downscale devices to make them even smaller, the downscaling technology of electronic intergrated circuits is rapidly approaching its limits. On the other hand, the downscaling technology of systems integration (methods of packing integrated circuit chips for installation on a wiring board) has not been as thoroughly investigated.

One approach to optimize the size and weight of an electronic system has been monolithic wafer scale integration (WSI). In monolithic WSI, a silicon wafer is constructed as a usable system module. The wafer is then placed in an electronic device as an entity rather than sawing the individual chips from the wafer. A problem with this method is that one defective chip on the wafer can destroy the entire system module.

A previously attempted resolution to eliminate the problem of a defective chip within the wafer is termed the hybrid WSI technique. In hybrid WSI, fully functional pretested chips are reassembled and interconnected onto a silicon wafer substrate. The substrate provides the necessary interconnects to form a system module. However, the hybrid WSI technique cannot provide sufficiently downscaled devices and requires relatively long interconnect distances which can limit the speed of the system. A need thus exists for a method of mounting semiconductor chips into a small system module that is lightweight, compact and reliable.

SUMMARY OF THE INVENTION

The present invention disclosed and claimed herein describes an orthogonal chip mount system module and method which substantially eliminates or reduces problems or disadvantages associated with prior chip mounting systems. The present invention allows the mounting of semiconductor chips into an orthogonal system module which is compact, lightweight and reliable.

In accordance with one aspect of the present invention, an apparatus for mounting semiconductor chips is provided which comprises a base module having orthogonal slots machined into it for receiving semiconductor chips. The semiconductor chips are interconnected to the base module to form a functional system module which may then be installed into an electronic system.

In another aspect of the present invention, the base module comprises a silicon member. Slots are machined into the base module for receiving semiconductor chips. A silicon interconnect chip is fixed to the base module and is provided with input/output solder pads that correspond with input/output solder pads on the semiconductor chips. After the semiconductor chips are installed into the slots and the solder pads are aligned, the base module is heated to the reflow temperature of the solder to provide electrical continuity and to create a functional system module.

It is a technical advantage of the present invention to provide a compact, lightweight system module while maintaining reliability. It is a further technical advantage in that the operating speed of the system module is enhanced due to the compact design. It is an even further technical advantage in that the entire system may be constructed from silicon.

BRIEF DESCRIPTION OF THE DRAWINGS

For a more complete understanding of the present invention and for further advantages thereof, reference is now made to the following Detailed Description taken in conjunction with the accompanying Drawings in which.

DETAILED DESCRIPTION OF THE INVENTION

Figure 1:
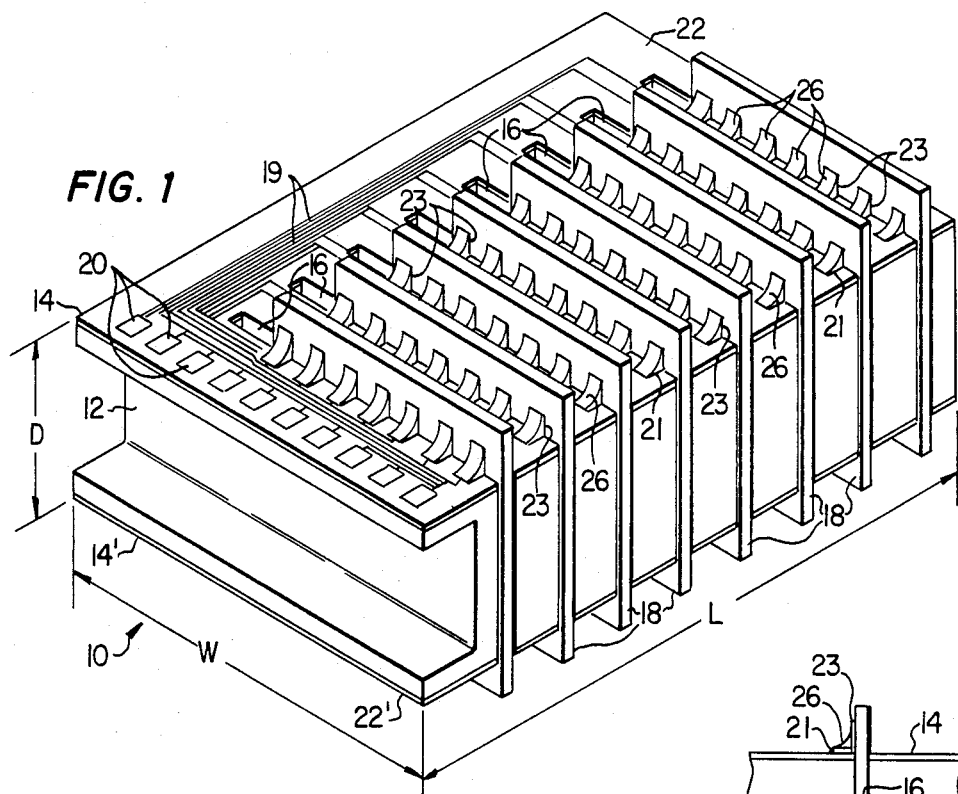
FIG. 1 is a perspective view of the preferred embodiment of, the present invention.

Referring to FIG. 1, an orthogonal chip mount system module according to the preferred embodiment of the present invention is generally indicated by the reference numeral 10. The system module 10 comprises a base module 12, at least one interconnect chip 14, eight slots 16 and a corresponding number of eight semiconductor integrated circuit chips 18 which fit in slots 16. It is to be understood that the number of slots 16 and the corresponding number of chips 18 may be varied as required.

According to the preferred embodiment, the base module 12 comprises silicon. The base module 12 has a length L, a width W and a depth D. Generally, the length L is greater than the width W which is in turn greater than the depth D. The orthogonal slots 16, generally perpendicular to the length L and parallel to the width W, are formed by any appropriate method, such as, laser drilling, chemical processing, mechanical machining or cutting, preferably by sawing (due to the brittleness of silicon), through the silicon. A typical chemical process that may be used to form the slots 16 includes the use of a crystal silicon <110> orientation and an orientation dependent wet etch. The wet etch chemicals may be, for example, a potassium hydroxide plus water solution.

The slots 16 are formed to provide a slight interference fit with the semiconductor chips 18. As shown in FIG. 1, the slots 16 pass entirely through the base module 12, but it is to be understood that the slots 16 could be any desired depth and arrangement. The base module 12 thus serves to support chips 18, while also serving as a heat sink to absorb any heat generated by the semiconductor chips 18. If desired, the base module 12 may be coated with a high thermal conductivity material, such as silicon carbide or a diamond like material.

The interconnect chip 14 preferably comprises silicon with the same length L and width W as the base module 10 and is formed with a crystal silicon <110> orientation. A <110> orientation is chosen because it allows through slots with vertical sidewalls to be etched into the interconnect chip 14 using an orientation dependent wet etch. To etch these slots a thick field oxide is grown or deposited on the slice. Windows are then opened on the silicon dioxide field by a standard photo lithographic process to correspond with the slots 16 on the base module 12. The chip 14 is then immersed in a potassium hydroxide plus water solution to dissolve the exposed silicon and form vertical sidewalls in the chip 14. Vias are not required to be etched all the way through since any remaining depth may be cleared by back grinding to provide a complete opening. Slots or cutouts are thus formed in chip 14 to correspond with the slots 16 in the base module 12. If desired, the chip 14 may be coated with a high thermal conductivity, low electrical conductivity material, such as silicon carbide or diamond material. The material may be used to cover the silicon dioxide layer or replace the silicon dioxide layer, as appropriate.

Conductive interconnect lines 19, system module input/output (I/O) connectors 20 and interconnect chip I/0 pads 21 are formed on the interconnect chip 14 to provide electrical continuity throughout the interconnect chip 14. The interconnect chip 14 is covered on top surface 22, with any appropriate conductor, not shown, such as, for example, aluminum, copper or tungsten. The conductor is applied by a sputtering process as is well known in the art. Photo lithography and plasma etching processes, which are well known in the art, are used to define the interconnect lines 19, the I/O connectors 20 and I/O pads 21 in the desired pattern. The system I/O connectors 20 allow the system module 10 to be installed and connected to an electronic device, not shown.

It should be noted that it is desirable to use the interconnect chip 14 rather than form the interconnect lines 19 and the I/O's 20 and 21 directly on the silicon base module 12 in order to utilize conventional equipment used to process semiconductor chips. The base module 12 has a greater thickness than the typical five hundred microns thick semiconductor chip and is, therefore, not readily processable on most processing equipment currently utilized. It is to be understood, however, that the interconnect lines 19 and the I/O's 20 and 21 could be placed directly on the base module 12 with the use of specialized processing equipment.

The interconnect chip 14 is then fixed over the upper face of the base module 12 by any appropriate method, such as mallory seal, solder or epoxy. Depending upon the number of circuits on the semiconductor chips 18, as well as the number of semiconductor chips 18, a second interconnect chip 14' may be applied to connect leads on the bottom surface 22'.

It is desirable for the base module 12 and the interconnect chip 14 to have compatible thermal expansion rates. Since the system module 10 is likely to be subjected to numerous thermal cycles (temperature fluctuations from hot to cold and vice versa), compatible thermal expansion rates will help prevent failure of the system module 10 due to cracks or separations. It is also desirable to utilize a high thermal conductivity potting compound, not shown, such as thermon, silicone gel, silicon carbide or a diamond loaded compound to fill any space between the slots 16 and the semiconductor chips 18. The potting compound will help absorb stress forces and dissipate the thermal load.

Figure 2:
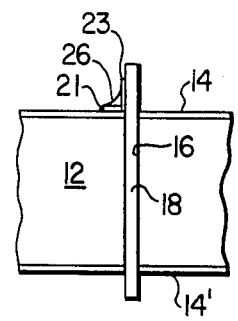
FIG. 2 is a cross-sectional view showing a solder joint of FIG. 1.

The semiconductor chips 18 are premanufactured to have integrated circuits, not shown, thereon. Referring simultaneously to FIGS. 1 and 2, each integrated circuit is provided with an input/output pad 23 to match with a corresponding interconnect chip input/output pad 21. The input/output pads 21 and 23 are metallized, such as, for example, with copper. Once the semiconductor chips 18 are inserted into the base module 12 and the input/output pads 21 and 23 are properly aligned solder bumps are applied, if not already applied, to each input/output pad 21 and 23 to allow a connection between the semiconductor chip 18 and the interconnect chip 14. The system module 10 is then heated to the reflow temperature of the solder to form the joints 26. The system module 10 is then ready for assembly into an electronic device or if necessary, the system module 10 may be sealed by any appropriate method, such as encasing the system module 10 in plastic.

It should be noted that the semiconductor chips 18 in one module may be of different sizes and aspect ratio. Some may be interconnected only on one side while others may be interconnected on both sides.

Figure 3:
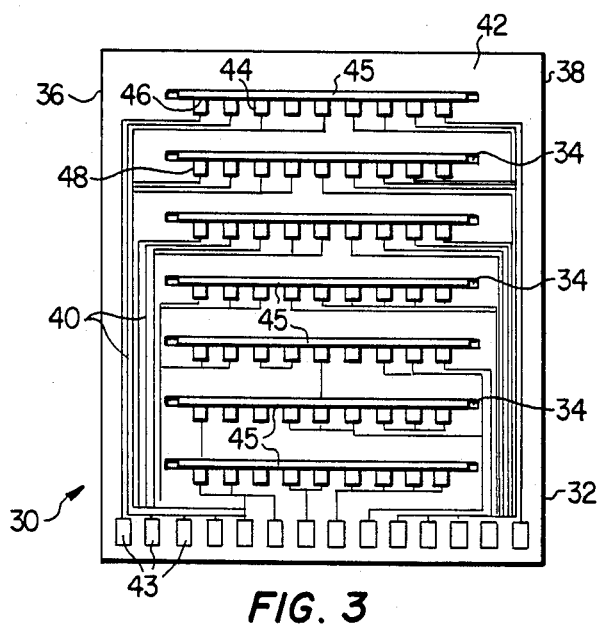
FIG. 3 is a top view of an alternate embodiment of the present invention.

Referring to FIG. 3, a top view of an alternate embodiment of the present invention is shown. An orthogonal chip mount system module is generally identified by the reference numeral 30. The system module 30 comprises a base module 32. The base module 32 comprises graphite coated with a layer of silicon carbide. The silicon carbide is deposited on the graphite by chemical vapor deposition as is well known in the art.

Slots 34 are formed in the base module 32 by any appropriate means, such as by drilling and/or sawing. Since graphite is not as brittle as silicon, it is possible to form the slots 34 by drilling so that the slots do not reach to the side edges 36 and 38 of the base module 32. The space between the ends of the slots 34 and the edges 36 and 38 allow interconnect lines 40 to be formed along both edges of an interconnect chip 42.

The interconnect chip 42 is formed with slots which mate with slots 34 and is placed on at least one surface of the base module 32 b any appropriate method, such as epoxy. The conductive interconnect chip 42, the interconnect lines 40, the system module I/O connectors 43 and the interconnect chip I/O pads 44 are formed in the same manner as the interconnect chip 14, the interconnect lines 19 and the I/O's 20 and 21 as described above.

Semiconductor chips 45 are premanufactured for insertion into the slots 34. Input/output pads 46 on chips 45 match with the interconnect chip input/output pads 44. After the semiconductor chips 45 are inserted into the base module 32 and the input/output pads 44 and 46 are properly aligned, the system module 30 is heated to the reflow temperature of the solder to form the solder joints 48. The system module 30 may now be sealed, if required, and installed into an electronic assembly.

As an example of the improvement in size due to the present invention, a device constructed according to FIG. 3 (OCM), and a previous state-of-the-art Single Inline Package (SIP) module, not shown, were compared in thickness, width, length and volume. Each module was provided with nine identical semiconductor chips giving each module the same functioning capability. The results were:

|  | Thickness | Width | Length | Volume |
|---|---|---|---|---|
| SIP Module | = 0.2" | × 0.8" | × 3.5" | = 0.56 cu. in. |

-continued

|  | Thickness | Width | Length | Volume |
|---|---|---|---|---|
| SIP Module | =0.2" | × 0.8" | × 3.5" = | 0.56 cu. in. |
| OCM Module | =0.18" | × 0.625" | × 0.7" = | 0.079 cu. in. |

Thus it can be seen that, in this example, the volume ratio (0.56/0.079) indicates a volume improvement by the present invention of over seven times.

Although the present invention has been described with respect to a specific preferred embodiment thereof, various changes and modifications may be suggested to one skilled in the art, and it is intended that the present invention encompass such changes and modifications as fall within the scope of the appended claims.

What is claimed is:

1. Apparatus for mounting semiconductor chips to form a system module, comprising a base module and means for interconnecting circuits on the semiconductor chips to said base module so that the chips and said base module form an integrated system module, said base module including orthogonal slots for receiving the semiconductor chips and further including a base portion and at least one interconnect chip fixed to said base portion, said interconnect chip having cutouts corresponding to said slots on said base module.

2. The apparatus of claim 1, wherein said interconnect chip comprises silicon coated with silicon dioxide.

3. The apparatus of claim 1, wherein said base portion comprises silicon.

4. The apparatus of claim 1, wherein said base portion comprises graphite coated with silicon carbide.

5. The apparatus of claim 1, wherein said means for interconnecting comprises:
   input/output solder pads on said interconnect chip;
   input/output connectors on said interconnect chip to allow connection to an electronic device;
   input/output solder pads on the semiconductor chips;
   interconnect lines on said interconnect chip between said solder pads on said interconnect chip and said connectors on said interconnect chip; and
   joints formed by aligning said solder pads on said interconnect chip with said solder pads on the semiconductor chips such that electrical continuity is formed from the semiconductor chips to the interconnect chip.

6. An improved semiconductor chip system module comprising
   a plurality of semiconductor chips having the same or different sizes, each having electrical devices formed thereon,
   a base module and means for electrically connecting circuits on said semiconductor chips to said base module to provide a system module,
   said base module including dimensions of length, width and depth and further including:
   orthogonal slots perpendicular to said length and parallel to said width machined into said base module and dimensioned to receive said chips to maintain said chips within said module in a parallel configuration;
   a base section having a top and a bottom surface; and
   an interconnect chip attached to at least said top surface of said base section,
   said interconnect chip having windows formed therethrough to correspond with said orthogonal slots.

7. The improved semiconductor system module of claim 6, wherein said base section comprises silicon.

8. The improved semiconductor system module of claim 6, wherein said base section comprises graphite coated with silicon carbide.

9. The improved semiconductor system module of claim 6, wherein said interconnect chip comprises silicon coated with silicon carbide.

10. The improved semiconductor system module of claim 6, wherein said interconnect chip comprises silicon coated with a diamond loaded compound.

11. The improved semiconductor system module of claim 6, wherein said base section comprises silicon coated with a high thermal conductivity material.

12. The improved semiconductor system module of claim 11, wherein said material comprises silicon carbide.

13. The improved semiconductor system module of claim 11, wherein said material comprises a diamond loaded compound.

14. The improved semiconductor system module of claim 6, wherein said interconnect chip comprises silicon coated with silicon dioxide.

15. The improved semiconductor system module of claim 14, wherein said silicon dioxide is further coated with silicon carbide.

16. The improved semiconductor system module of claim 14, wherein said silicon dioxide is further coated with a diamond loaded compound.

17. A method of forming an improved semiconductor chip system module, comprising the steps of:
   forming a base module with electrical conductors thereon, said base module forming
   comprising forming a base portion, forming an interconnect chip having windows therethrough to match said orthogonal slots, forming input/output solder pads on said interconnect chip, and fixing said interconnect chip to said base portion;
   machining orthogonal slots into said base module;
   inserting semiconductor chips into said slots; and
   soldering circuits on the semiconductor chips to said electrical conductors on said base module to form an integral semiconductor chip system module.

18. The method of claim 17, wherein the step of forming an interconnect chip comprises:
   covering a silicon chip with silicon dioxide;
   patterning said silicon dioxide to match said orthogonal slots;
   immersing said silicon chip in a potassium hydroxide/water solution to eat through said silicon chip; and
   back grinding any remaining silicon and silicon dioxide in said pattern to form openings through said silicon chip.

19. The method of claim 17, wherein the step of soldering the semiconductor chips onto said base module comprises:
   forming input/output solder pads on the semiconductor chips corresponding to said input/output solder pads on said interconnect chip;
   matching said input/output solder pads on said interconnect chip to said input/output solder pads on the semiconductor chips; and
   reflowing said solder to form a joint between said interconnect chip and the semiconductor chips.

20. The method of claim 17, wherein the step of fixing said interconnect chip to said base portion comprises gluing said interconnect chip to said base portion.

* * * * *